United States Patent
Matos Cordeiro Costa et al.

(10) Patent No.: US 10,634,248 B2
(45) Date of Patent: Apr. 28, 2020

(54) PISTON RING AND PROCESS FOR THE MANUFACTURE THEREOF

(71) Applicants: Mahle Metal Leve S/A, Jundiaí (BR); Mahle International GmbH, Stuttgart (DE)

(72) Inventors: Sandra Matos Cordeiro Costa, Jundiaí (BR); Gisela Ablas Marques, Jundiaí (BR)

(73) Assignees: MAHLE METAL LEVE S/A (BR); MEHLE INTERNATIONAL GMBH (DE)

( * ) Notice: Subject to any disclaimer, the term of this patent is extended or adjusted under 35 U.S.C. 154(b) by 661 days.

(21) Appl. No.: 15/121,289

(22) PCT Filed: Feb. 9, 2015

(86) PCT No.: PCT/EP2015/052622
§ 371 (c)(1),
(2) Date: Aug. 24, 2016

(87) PCT Pub. No.: WO2015/128178
PCT Pub. Date: Sep. 3, 2015

(65) Prior Publication Data
US 2017/0016538 A1 Jan. 19, 2017

(30) Foreign Application Priority Data
Feb. 25, 2014 (BR) .............................. 102014004402

(51) Int. Cl.
*F16J 9/26* (2006.01)
*C23C 14/06* (2006.01)
(Continued)

(52) U.S. Cl.
CPC ............. *F16J 9/26* (2013.01); *C23C 14/0641* (2013.01); *C23C 14/48* (2013.01); *C23C 28/042* (2013.01); *C23C 28/044* (2013.01)

(58) Field of Classification Search
CPC ........................................................ F16J 9/26
See application file for complete search history.

(56) References Cited

U.S. PATENT DOCUMENTS

| | | | | |
|---|---|---|---|---|
| 5,316,321 A | * | 5/1994 | Ishida | ......................... F16J 9/26 277/443 |
| 5,405,154 A | * | 4/1995 | Tsuchiya | ................. B23P 15/06 277/443 |

(Continued)

FOREIGN PATENT DOCUMENTS

| | | |
|---|---|---|
| GB | 2367304 A | 4/2002 |
| JP | 2007271072 A | 10/2007 |
| JP | 2007298103 A | 11/2007 |

OTHER PUBLICATIONS

English abstract for JP-2007298103.
English abstract for JP-2007271072.

*Primary Examiner* — Kristina R Fulton
*Assistant Examiner* — L. Susmitha Koneru
(74) *Attorney, Agent, or Firm* — Fishman Stewart PLLC (57) ABSTRACT

A piston ring for a piston of an internal combustion engine may include a body composed of a ferrous material. The body may have an upper portion, a lower portion opposed to the upper portion, an internal portion configured to face towards a piston groove and an external portion opposed to the internal portion. An upper chamfer may be disposed between the upper portion and the external portion. A lower chamfer may be disposed between the lower portion and the external portion. The upper portion, the lower portion and the internal portion may each have a nitrided layer. The external portion, the upper chamfer and the lower chamfer (Continued)

may include at least one ion plated coating layer. The nitrided portion in at least a superficial layer may have a hardness of 700 HV or less.

18 Claims, 4 Drawing Sheets

(51) Int. Cl.
*C23C 28/04* (2006.01)
*C23C 14/48* (2006.01)

(56) References Cited

U.S. PATENT DOCUMENTS

| | | | | |
|---|---|---|---|---|
| 5,582,414 | A | * 12/1996 | Miyazaki | C23C 14/0641 277/444 |
| 6,508,473 | B1 | 1/2003 | Tanaka et al. | |
| 7,024,982 | B2 | * 4/2006 | Aizawa | F16J 9/22 277/442 |
| 2002/0117808 | A1 | * 8/2002 | Ogawa | C23C 8/26 277/443 |
| 2006/0269790 | A1 | * 11/2006 | Sarabanda | C23C 14/025 428/698 |
| 2009/0278320 | A1 | * 11/2009 | Araujo | C23C 14/0036 277/442 |

* cited by examiner

Fig. 5A Cross-section A-A

Fig. 5B Cross-section A-A

PISTON RING AND PROCESS FOR THE MANUFACTURE THEREOF

CROSS-REFERENCE TO RELATED APPLICATIONS

This application claims priority to Brazilian Patent Application No. 10 2014 004402 7, filed Feb. 25, 2014, and International Patent Application No. PCT/EP2015/052622, filed Feb. 9, 2015, both of which are hereby incorporated by reference in their entirety.

TECHNICAL FIELD

The present invention relates to a piston ring, designed particularly for use in internal combustion engines, based on martensitic stainless steel, having the upper, lower and internal faces nitrided and the external face, which comes into contact with the wall of the cylinder/liner, not nitrided and provided with at least one layer of coating applied by the process of ion plating.

Through this new and improved coating of chromium nitride there is achieved an increase in the working life of the piston ring in diesel engines having a high combustion pressure and high rotational speed (known commercially as HSD (high-speed diesel) engines), particularly when compared with the piston rings currently utilised in this type of engine, whereof the totality is nitrided and, following nitriding, receives on the external face and upper and lower chamfers thereof a layer of coating applied by the process of physical vapour deposition (PVD). These advantages are obtained without any corresponding disadvantageous technical counterpart being encountered whilst maintaining the manufacturing costs at a competitive level.

The present invention relates furthermore to the process for the manufacture of the ring.

BACKGROUND

In internal combustion piston engines the rings are formed, in general, of a metal base to which there is applied at least one layer of coating which comes into contact with the wall of the cylinder. As an example, there may be cited a base of cast iron or of stainless steel, utilised as a function of the cost and/or of the type of stress to which the ring will be subjected.

The role of the layer of coating is very important because of the fact that it seeks to confer properties on the ring of low sliding friction and high spalling resistance, hardness and toughness. Nevertheless, it must be noted that some of these properties conflict and an increase in one thereof means a loss of performance in another, because whereof the type of coating to be utilised will be selected as a function of the operational profile of the engine and of the stresses whereto the rings will be submitted during their working life.

In an internal combustion engine the compression ring, or first groove ring, is that which experiences most stresses by virtue of being in direct contact with the superheated gases of the burning compressed air mixture. Consequently, by virtue of the very location thereof, they are continually exposed to high temperatures and to aggressive byproducts of the combustion.

A series of coatings has been proposed by those skilled in the art, each thereof seeking to improve the properties desired, increasing the strength of the piston rings. Several prior art refers to the ceramic coatings of chromium nitride in the form of CrN and/or $Cr_2N$, very efficient and technically interesting because of the fact that they balance in a very competent manner the properties of absorption of internal stress, high hardness and low thickness, greatly reducing the occurrence of spalling.

In the great majority of the applications the ceramic coating of chromium nitride is applied by the PVD process, according whereby the material to be deposited as a coating is vaporised from a solid source in the form of atoms or molecules by means of low-pressure gases (or plasma) in the direction of the piston ring, whereon it condenses. The formation of the coating on the substrate depends on the materials vaporised and on the material of the substrate, on the conditions of the surface, on the energy available (temperature and ion bombardment), and on the atmosphere (chemical reactions, reactive deposition, etc).

The PVD process presents some interesting advantages for the production of tribological coatings such as, for example, (i) the possibility of operating at very low working pressures thereby rendering possible the synthesis of materials of high purity; (ii) improvement in the adhesion of the coating to the substrate because of the possibility of "cleaning" the surface of the substrates by means of the ion bombardment; (iii) uniform thickness of the coating; (iv) control over the crystalline structure of the coating; and (v) relatively low deposition temperatures. As additional advantages ion bombardment promotes epitaxial growth and improves the atomic mobility, and normally no effluents or pollutants are utilised because of the fact that in the majority of cases toxic products or solutions are not involved.

In the specific case of engines of the high-speed diesel type, because of the high combustion pressures and the high rotational speeds which they reach, the rings are very stressed, in particular the compression rings. For that reason, compression rings are in general specified having a base constituted of stainless steel the totality thereof being nitrided, having a wear-resistant coating applied to the external face, a posteriori, by the PVD process.

This type of ring is known for its high mechanical strength and by the high price thereof, nevertheless in some applications even they do not manage to prevent the emergence and propagation of cracks, not only in the coating but in the entire ring, which may lead to a catastrophic failure entailing the disassembly of the engine.

In these situations, cracks are initiated at the upper and lower chamfers, being respectively the edges joining the lateral face to the upper face and to the lower face. In some cases the cracks ends up by propagating throughout the cross-section of the ring, rupturing the part and requiring the complete disassembly of the engine.

With the objective of solving this difficulty, the U.S. Pat. No. 6,508,473 reveals a piston ring based on stainless steel nitrided on the upper and lower faces thereof. The nitrided faces have a hardness of 700 HV. The ring comprises furthermore a film of hard coating on the external face thereof in contact with the wall of the liner/cylinder, spaced from 0.0001 mm to 0.3 mm from the upper and lower faces. According to the patent, this spacing, although minimal, prevents the propagation of cracks up to a reasonable limit of utilisation, however in regimes of severe utilisation this technique does not guarantee the strength of the ring.

Up to the present time a piston ring, especially a compression or first groove ring, has not been developed which manages to attain the standards of durability demanded in severe applications, such as those demanded by the diesel engines operating at high feed pressures and at high rotational speeds.

SUMMARY

The present invention has as object thereof a piston ring, particularly a compression or first groove ring for use in internal combustion engines not presenting the occurrence of potentially catastrophic cracks even when functioning under the critical operating conditions of diesel engines which operate with high feed pressures and at high rotational speeds.

The present invention also has as object thereof a piston ring, particularly a compression or first groove ring, for use in internal combustion engines, based on martensitic stainless steel, having the upper, lower and internal faces nitrided and the external face, which comes into contact with the wall of the cylinder/liner, not nitrided and provided with at least one layer of coating applied by the process of ion plating.

Furthermore, the present invention has as object thereof a piston ring, particularly a compression or first groove ring for use in internal combustion engines, for use in diesel engines operating at high feed pressures and at high rotational speeds, satisfying the design and durability objectives and maintaining a competitive manufacturing cost in relation to the rings presently utilised.

Finally, the present invention has as object thereof a manufacturing process objectified in the three foregoing paragraphs.

The objects of the present invention are achieved by a piston ring, for utilization in the piston groove of a piston of an internal combustion engine, provided with a body composed of a ferrous material defining an upper portion facing towards the piston head, a lower portion, opposed, facing towards the piston skirt, an internal portion facing towards the piston groove and an external portion, opposed, to slide against the cylinder wall or liner, the upper and external portions being essentially mutually orthogonal and defining an upper chamfer and the lower and external portions being essentially mutually orthogonal and defining a lower chamfer, wherein (i) the upper, lower and internal portions are nitrided, and (ii) the internal portion and the upper and lower chamfers are not nitrided and coated by at least one layer of coating deposited by the process of ion plating.

Additionally, the objects of the present invention are achieved by a process for the manufacture of a piston ring as defined in the above paragraph, comprising the following stages:

Stage (i): nitriding the upper, lower and internal portions, and

Stage (ii): deposition of at least one layer of coating on the internal portion and on the upper and lower chamfers by the process of ion plating.

BRIEF DESCRIPTION OF THE DRAWINGS

The present invention shall be described below in greater detail, based on an example of embodiment represented in the drawings. The figures show.

DETAILED DESCRIPTION

Figure 1:
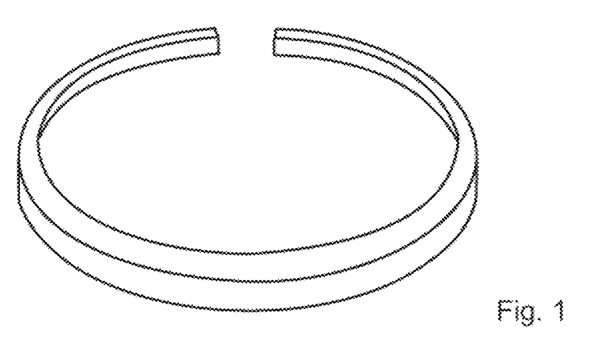
FIG. 1 is a schematic perspective view of any compression ring.

FIG. 1 represents in schematic form any piston ring for utilisation in an internal combustion engine. The present invention relates to a piston ring for use in the piston groove of the piston of an internal combustion engine. The preferable embodiment of the ring 1 object of the present invention is the compression ring of an engine operating according to the high rotational speed diesel cycle wherein there is high combustion pressure (high-speed diesel type), however it is evident that it may assume any other required or desirable embodiment, such as a second groove ring, an oil ring, or even any other embodiment.

Figure 2:
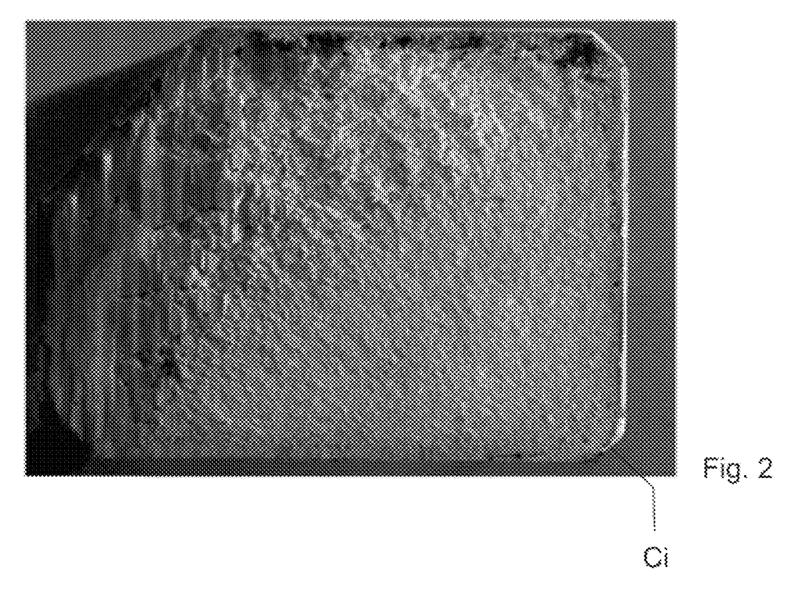
FIG. 2 is a magnified cross-sectional view of a compression ring of the prior art, after fracture/breakage in its cross-section.

FIG. 2 reveals a ring of the prior art utilised in an engine of the high-speed diesel type. There may be seen therein a magnified cross-sectional view of a compression ring of the prior art after fracture/breakage of its cross-section. The figure permits it to be seen that the initiation of the crack occurred at the lower chamfer and, with the passage of time, propagated across the cross-section of the ring until the catastrophic failure, entailing the total disassembly of the engine.

The applicant has executed exhaustive tests with this type of ring of the prior art, a compression ring having a base constituted by stainless steel, the totality thereof being nitrided, with a wear-resistant coating being applied to the external face, a posteriori, by the PVD process.

From that study, the applicant has concluded that:

(i) That type of catastrophic failure is related to the fact of the coating layer being applied by PVD and onto a nitrided surface→when the layer was applied directly onto the ferrous base material, the crack resistance was greater, although there were concerns in respect of the wear through friction;

(ii) The crack/fissure initiates at approximately 180° from the region of the opening of the ring and at the lower chamfer.

(iii) The occurrence of cracks/fissures was greater as greater the thickness of the nitrided layer in the region of the chamfer.

Figure 3:
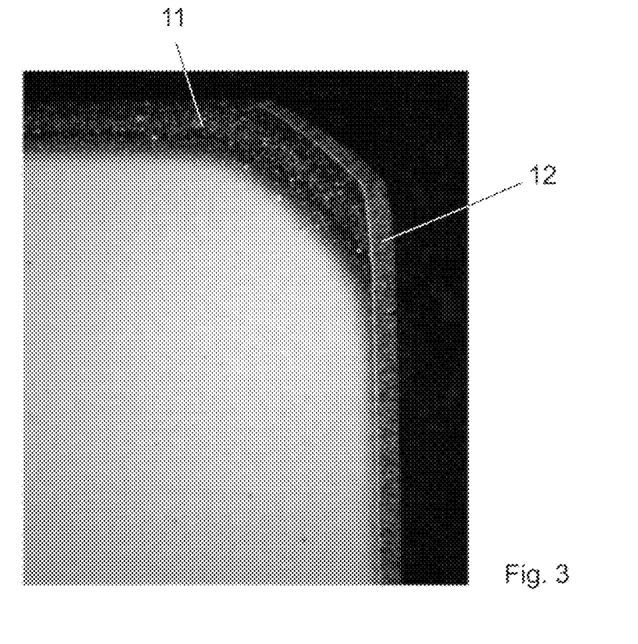
FIG. 3 is a microscopic cross-sectional view of a compression ring of the prior art in the region of the upper chamfer thereof.
Figure 4:
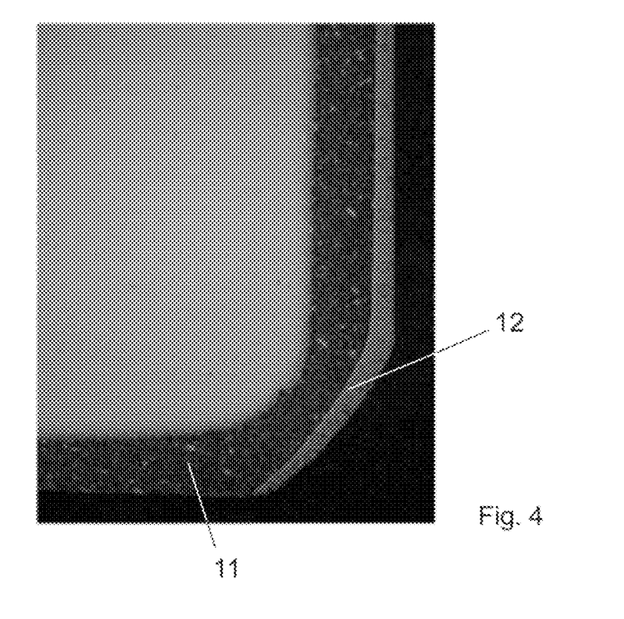
FIG. 4 is a microscopic cross-sectional view of a compression ring of the prior art in the region of the lower chamfer thereof.

FIGS. 3 and 4 illustrate microscopic cross-sectional views of a compression ring of the prior art, respectively in the region of the upper and lower chamfers thereof. In these two figures there may be clearly seen the greater thickness of the nitrided layer 11 on the chamfers, over which the coating layer 12 is applied by PVD.

Taking as a basis the research and development thereof, the applicant has developed the present piston ring 1 which bravely satisfies the technical requirements of the high-speed diesel engines.

Figure 5:
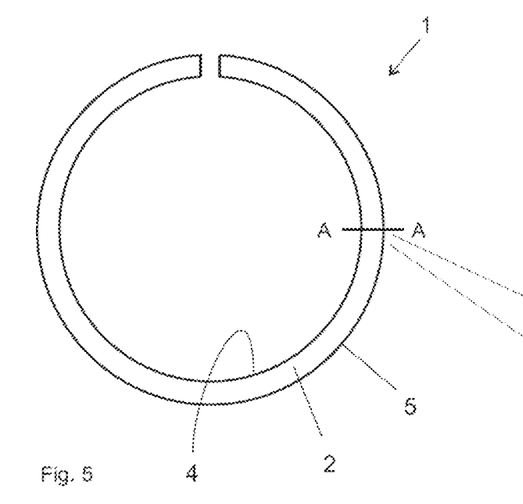
FIG. 5 is a schematic plan view of a non-limiting embodiment of the piston ring object of the present invention.
Figure 5A:
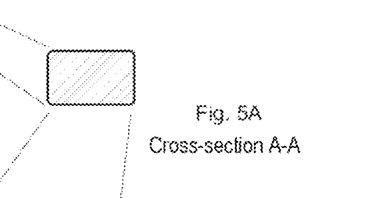
FIG. 5A is a schematic view of cross-section A-A of the piston ring illustrated in FIG. 5.
Figure 5B:
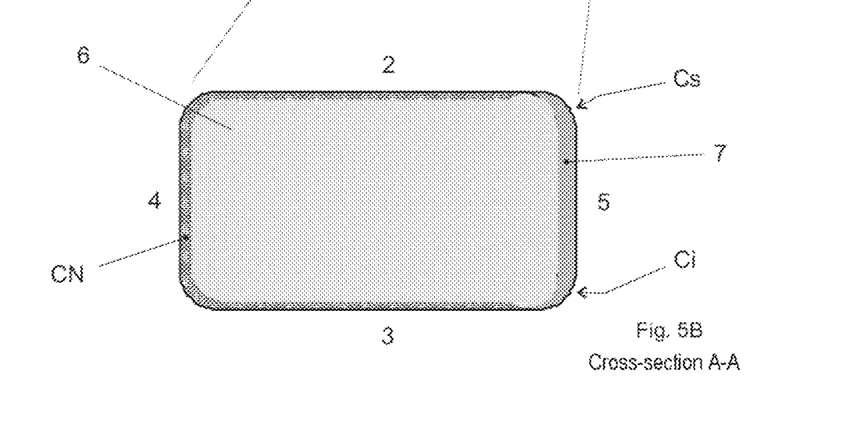
FIG. 5B is a magnified schematic view of cross-section A-A of the piston ring illustrated in FIGS. 5 and 5A.

Geometrically, the ring 1 object of the present invention is like any ring, that is to say a piston ring for utilisation in the groove of a piston of an internal combustion engine provided with a body 6 composed of a ferrous material defining an upper portion 2 facing towards the piston head, a lower portion 3, opposed, facing towards the piston skirt, an internal portion 4 facing towards the groove of the piston, and an external portion 5, opposed, to slide against the cylinder wall or liner (these latter not illustrated).

The upper and external portions 2, 5 are essentially mutually orthogonal and define an upper chamfer Cs, whereas the lower and external portions 3, 5, also essentially mutually orthogonal, define a lower chamfer Ci.

In a preferable manner, the body 6 is constituted by stainless steel containing essentially 13 to 18% chromium, this material being the most appropriate for the stresses of the high rotational speed diesel engines, however it is evident that it may vary if necessary or desirable. In an even more preferable, but not obligatory, manner the stainless steel utilized has the composition shown in the following table.

| Chemical element | Percentage |
| --- | --- |
| Carbon (C) | 0.80-0.95 |
| Silicon (Si) | 0.35-0.50 |
| Manganese (Mn) | 0.25-0.40 |
| Phosphorous (P) | 0.040 maximum |
| Sulphur (S) | 0.040 maximum |
| Chromium (Cr) | 17.0-18.0 |
| Molybdenum (Mo) | 1.00-1.25 |
| Vanadium (V) | 0.08-0.15 |

The great innovation of the ring 1 object of the present invention resides in the fact that the upper, lower and internal portions 2, 3, 4 are nitrided (see the CN layer visible in FIGS. 5B and 6), together with the internal portion 5 and the upper and lower chamfers Cs, Ci not being nitrided and coated with at least one layer of coating 7 deposited by the process of ion plating.

Figure 6:
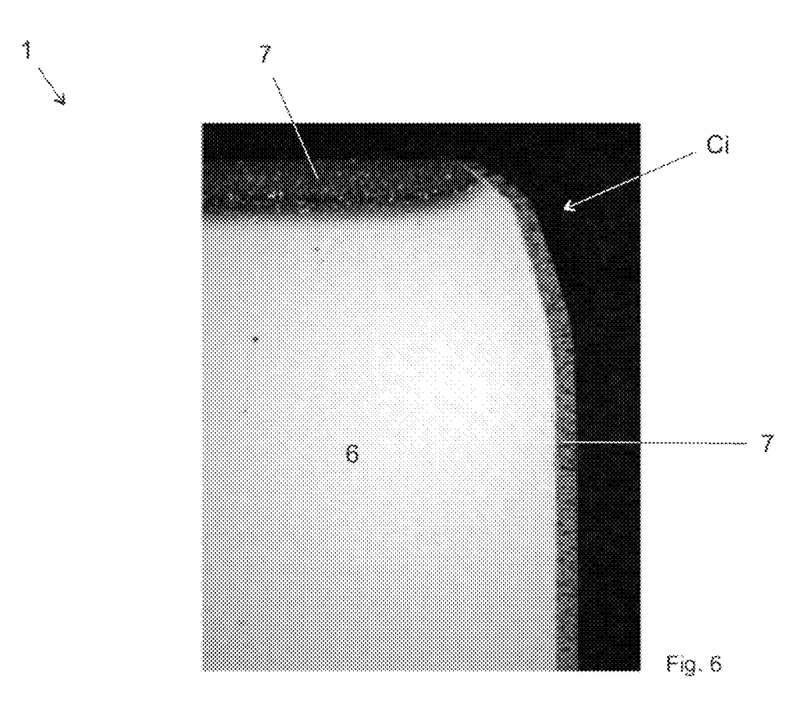
FIG. 6 is a microscopic cross-sectional view of a non-limiting embodiment of the piston ring, object of the present invention, in the region of the upper chamfer thereof.

In a preferable, but not obligatory, manner the layer of coating applied is composed of chromium nitride the greater part whereof being formed by the CrN phase, however it is evident that other alternatives may be utilised, such as the greater part of the chromium nitride having a phase of $Cr_2N$, a coating of niobium nitride, a multilayer coating of chromium nitride, or of chromium nitride and niobium nitride, or even any other necessary or desirable layer. In the preferable embodiment of the invention, the layer of coating 7 has a thickness of essentially 20 microns.

A further innovative characteristic of the ring 1 object of the present invention resides in the fact that the nitrided portions (the upper, lower and internal portions 2, 3 and 4) are subjected to a treatment creating a nitrided layer of lower hardness, having a reduced hardness of approximately 700 HV. A conventional process of gas nitriding can be described, being the process utilized in this product. That which ensures that the hardness is lower are the treatment parameters, adjusted such as to ensure a maximum hardness in the nitrided layer to prevent the formation of cracks/fissures and consequent breakage/rupture of the ring.

Figure 7:
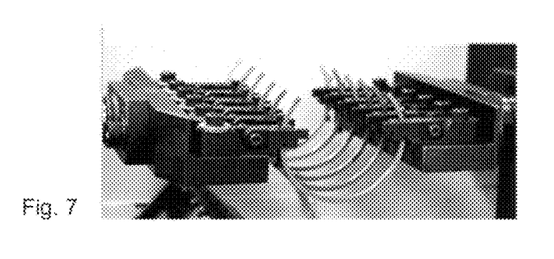
FIG. 7 is a view of test equipment with six rings object of the present invention for a fatigue test.
Figure 8:
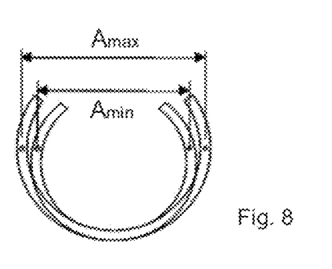
FIG. 8 is a schematic view of the stresses to which the rings are subjected in the equipment illustrated in FIG. 7.

FIG. 7 is a view of a test apparatus with six rings object of the present invention for a fatigue test. As may be seen, the machine comprises two heads with means to clasp/fasten six piston rings, such that each head secures the ring adjacently to the opening thereof. During the test, the machine moves open extremities of the rings closer together and separates them such that the rings are forced between a position of maximum opening Amax and of minimum opening Amin, as may be seen in FIG. 8.

Figure 9:
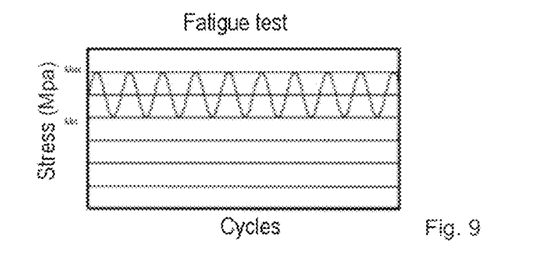
FIG. 9 is a graph representing the stress experienced by a ring during the cycles of the fatigue test realised by the equipment illustrated in FIG. 7.

FIG. 9, in its turn, shows a graph representing the stress experienced by the ring during the cycles of the fatigue test carried out by the equipment illustrated in FIG. 7. With the ring of the state of the art, after a certain number of cycles the breakage/rupture of the part occurred, while the ring 1 object of the present invention endured this test without breaking/rupturing.

The process for the manufacture of the piston ring herein revealed is also a new invention, comprising the following stages:

Stage (i): deposition of at least one coating layer 7 on the external portion 5 and on the upper and lower chamfers Cs, Ci, by the process of ion plating.

Stage (ii): nitriding of the upper, lower and internal portions 2, 3, 4.

As mentioned above, the coating layer 7 applied in stage (i) is a layer of chromium nitride formed in a preferential manner by CrN and having a preferential thickness of essentially 20 microns.

Finally, the process additionally comprises a stage of treatment creating a nitrided layer having lower hardness in the nitrided portions.

Having being described an example of preferred embodiment, it shall be understood that the scope of the present invention encompasses other possible variations, being limited solely by the content of the appended claims, included therein the possible equivalents.

The invention claimed is:

1. A piston ring for a piston of an internal combustion engine, comprising:
    a body composed of a ferrous material, the body defining an upper portion facing towards a piston head, a lower opposed portion facing towards a piston skirt, an internal portion facing towards a piston groove, and an external opposed portion configured to slide against a cylinder wall or liner, wherein the upper portion and the external portion are disposed essentially mutually orthogonal and define an upper chamfer at an upper corner of the body, and the lower portion and the external portion are disposed essentially mutually orthogonal and define a lower chamfer at a lower corner of the body:
    wherein the upper portion, the lower portion and the internal portion each have a nitrided portion, the nitrided portion in at least a superficial layer having a hardness of 700 HV or less; and wherein the external portion, the upper chamfer and the lower chamfer are not nitrided and include at least one ion plated coating layer, the at least one coating layer disposed directly on the ferrous material of the body at the external portion, the upper chamfer, and the lower chamfer, and wherein the at least one ion plated coating layer is disposed on the upper chamfer and the lower chamfer without contacting an adjacent surface of the nitrided portion disposed on the upper portion and the lower portion, respectively.

2. The piston ring according to claim 1, comprising at least one of a compression ring and a first groove ring.

3. The piston ring according to claim 1, wherein the ferrous material of the body is composed of stainless steel containing 13% to 18% chromium.

4. The piston ring according to claim 1, wherein the at least one coating layer is a layer of chromium nitride, and wherein the layer of chromium nitride is predominantly composed of CrN.

5. The piston ring according to claim 4, wherein the at least one coating layer has a thickness of essentially 20 microns.

6. The piston ring according to claim 1, wherein the nitrided portion further includes a nitrided layer having a hardness lower than the hardness of the superficial layer.

7. A process for producing a piston ring, comprising:
providing a body composed of a ferrous material, the body having an upper portion configured to face towards a piston head, a lower portion opposed to the upper portion and configured to face towards a piston skirt, an internal portion configured to mate with a piston groove, and an external portion opposed to the internal portion and configured to slide against a surface of a cylinder, an upper chamfer disposed between the upper portion and the external portion, and a lower chamfer disposed between the lower portion and the external portion; nitriding the upper portion, the lower portion and the internal portion; and depositing at least one coating layer on the external portion and on the upper chamfer and the lower chamfer by an ion plating process, wherein depositing the at least one coating layer on the external portion and on the upper chamfer and the lower chamfer includes applying the at least one coating layer directly onto the ferrous material of the body; and
wherein nitriding the upper portion, the lower portion and the internal portion includes nitriding the ferrous material of the body to provide a nitrided layer having a hardness of 700 HV or less on the upper portion and the lower portion without nitriding the upper chamfer and the lower chamfer, wherein the nitrided layer is spaced apart from the at least one coating layer at the upper chamfer and the lower chamfer, respectively.

8. The process according to claim 7, wherein depositing the at least one coating layer includes depositing a layer of chromium nitride formed principally of CrN.

9. The process according to claim 7, wherein depositing the at least one coating layer includes forming a layer thickness of essentially 20 microns.

10. The process according to claim 7, wherein the hardness of 700 HV or less is formed superficially on the nitrided layer.

11. The process according to claim 7, wherein the upper chamfer is disposed at an upper corner of the body joining the upper portion and the external portion, and the lower chamfer is disposed at a lower corner of the body joining the lower portion and the external portion; and
wherein nitriding the upper portion, the lower portion and the internal portion is performed without nitriding the external portion, the upper chamfer and the lower chamfer such that the nitrided layer is separated from the at least one coating layer via an intervening portion of the ferrous material of the body at the upper chamfer and the lower chamfer, respectively.

12. The piston ring according to claim 1, wherein the ferrous material of the body has a composition including:
0.80%-0.95% carbon;
0.35%-0.50% silicon;
0.25%-0.40% manganese;
up to 0.040% phosphorous;
up to 0.040% sulfur;
17.0%-18.0% chromium;
1.00%-1.25% molybdenum; and
0.08%-0.15% vanadium.

13. A piston ring for a piston of an internal combustion engine, comprising:
a body composed of a stainless steel material, wherein the body is structured to have:
an upper portion configured to face towards a region of combustion;
a lower portion opposed to the upper portion and configured to face towards a piston skirt;
an internal portion configured to face towards a piston groove;
an external portion opposed to the internal portion and configured to slide against a surface of a cylinder;
an upper chamfer disposed between the upper portion and the external portion;
a lower chamfer disposed between the lower portion and the external portion;
wherein the upper portion and the external portion are disposed essentially mutually orthogonal to one another and define the upper chamfer therebetween at an upper corner of the body joining the upper portion and the external portion; and
wherein the lower portion and the external portion are disposed essentially mutually orthogonal to one another and define the lower chamfer therebetween at a lower corner of the body joining the lower portion and the external portion;
wherein the upper portion, the lower portion and the internal portion each have a nitrided portion, the nitrided portion including at least a superficial layer having a hardness of 700 HV or less; and
wherein the external portion, the upper chamfer and the lower chamfer each include at least one ion plated coating layer without the nitrided portion, and wherein the at least one coating layer is disposed directly on the stainless steel material of the body at the external portion, the upper chamfer, and the lower chamfer without contacting an adjacent surface of the nitrided portion disposed on the upper portion and the lower portion, respectively.

14. The piston ring according to claim 13, wherein the nitrided portion on the upper portion ends before reaching the upper chamfer and the nitrided portion on the lower portion ends before reaching the lower chamfer, and wherein the at least one coating layer disposed on the upper chamfer and the lower chamfer is separated from the nitrided portion disposed on the upper portion and the lower portion via an intervening portion of the stainless steel material, respectively.

15. The piston ring according to claim 13, wherein the at least one coating layer includes a chromium nitride layer composed principally of CrN.

16. The piston ring according to claim 1, wherein the at least one coating layer disposed on the upper chamfer and the lower chamfer is separated from the nitrided portion disposed on the upper portion and the lower portion via an intervening portion of the ferrous material of the body, respectively.

17. The piston ring according to claim 1, wherein the nitrided portion on the upper portion ends before reaching the upper chamfer, and the nitrided portion on the lower portion ends before reaching the lower chamfer.

18. The process according to claim 7, wherein the at least one coating layer is disposed on the upper chamfer and the lower chamfer without contacting an adjacent surface of the nitrided layer disposed on the upper portion and the lower portion, respectively.

\* \* \* \* \*

UNITED STATES PATENT AND TRADEMARK OFFICE
CERTIFICATE OF CORRECTION

PATENT NO. : 10,634,248 B2
APPLICATION NO. : 15/121289
DATED : April 28, 2020
INVENTOR(S) : Matos Cordeiro Costa et al.

It is certified that error appears in the above-identified patent and that said Letters Patent is hereby corrected as shown below:

On the Title Page

At Column 1, Item (73) under the Assignees, please change "MEHLE" to "MAHLE".

Signed and Sealed this
First Day of September, 2020

Andrei Iancu
*Director of the United States Patent and Trademark Office*